United States Patent
Murao et al.

[11] Patent Number: 6,014,012
[45] Date of Patent: Jan. 11, 2000

[54] APPARATUS FOR MANAGING A BATTERY UNIT HAVING STORAGE BATTERIES

[75] Inventors: Tetsuro Murao; Tamotsu Motozu; Tomonobu Tsujikawa; Yuji Kawagoe, all of Tokyo, Japan

[73] Assignee: NTT Power and Building Facilities Inc., Tokyo, Japan

[21] Appl. No.: 09/265,200

[22] Filed: Mar. 10, 1999

[30] Foreign Application Priority Data

Jul. 28, 1998 [JP] Japan .................................. 10-212671
Jul. 31, 1998 [JP] Japan .................................. 10-217441

[51] Int. Cl.[7] .................................................. H01M 10/46
[52] U.S. Cl. ........................ 320/116; 320/132; 320/134; 320/150
[58] Field of Search .................................... 320/116, 119, 320/127, 128, 132, 134, 136, 150, 153, 163

[56] References Cited

U.S. PATENT DOCUMENTS

5,710,503   1/1998   Sideris et al. ........................ 320/116 X
5,744,936   4/1998   Kawakami ............................... 320/120

*Primary Examiner*—Edward H. Tso
*Attorney, Agent, or Firm*—Christenson O'Connor Johnson & Kindness PLLC

[57] ABSTRACT

The voltages V of storage batteries Sa, Sb, . . . Sn are detected, and the voltage E of the battery unit 10 is detected. A defect in each storage battery is detected in accordance with the voltage V detected. An abnormal voltage of the battery unit 10 is detected in accordance with the voltage E detected. Further, the temperature T of the battery unit 10 is detected, on the basis of which the expiration of each storage battery is determined. The defect detected, the abnormal voltage detected, and the expiration determined are informed.

12 Claims, 7 Drawing Sheets

APPARATUS FOR MANAGING A BATTERY UNIT HAVING STORAGE BATTERIES

The undersigned is fluent in both the English and Japanese languages, and submits attached is an accurate English language translation of: U.S. patent application Ser. No. 09/265,200, filed Mar. 10, 1999.

BACKGROUND OF THE INVENTION

The present invention relates to an apparatus for managing a battery unit to be incorporated into, for example, an uninterruptible power supply system.

The uninterruptible power supply system comprises a battery unit. Power is supplied from the battery unit to a load when the commercial AC power supply fails to supply power, whereby the load can be driven without break. The battery unit comprises a plurality of storage batteries connected in parallel or in series.

In the uninterrupted power supply system it is necessary to inspect each storage battery periodically.

Recently, sealed-type lead storage batteries are used in great quantities as storage batteries. The jar of a sealed-type lead storage battery is sealed. This makes it impossible to determine whether the electrodes in the jar have been corroded or whether the electrolyte in the jar is insufficient in amount. It is therefore very difficult to detect whether each storage battery is defective (due to, for example, manufacturing errors) or has expired.

If any one of the storage batteries is defective or has expired, the battery unit may no longer supply power to the load.

BRIEF SUMMARY OF THE INVENTION

The present invention has been made in view of the foregoing. Its object is to provide an apparatus for automatically managing, with high reliability, a battery unit having storage batteries, which can reliably detect and inform a defect in each storage battery and an abnormal voltage in the battery unit and reliably determine and inform the life of each storage battery, without requiring the service of inspection-maintenance workers.

An apparatus according to the present invention is designed to manage a battery unit having a plurality of storage batteries and comprises:

- a plurality of first voltage detecting means for detecting voltages of the storage batteries, respectively;
- second voltage detecting means for detecting a total voltage of the battery unit;
- defect detecting means for detecting defects in the storage batteries on the basis of the voltages detected by the first voltage detecting means;
- abnormality detecting means for detecting an abnormal voltage in the battery unit on the basis of the voltage detected by the second voltage detecting means;
- a plurality of temperature detecting means for detecting temperature in the battery unit;
- battery life determining means for determining a life of each of the storage batteries has dead, on the basis of the temperature detected by the temperature detecting means; and
- information means for informing results of the detection performed by the defect detecting means and abnormality detecting means and results of the determination made by the battery life determining means.

DETAIL DESCRIPTION OF THE INVENTION

An embodiment of the present invention will be described, with reference to the accompanying drawings.

Figure 1:
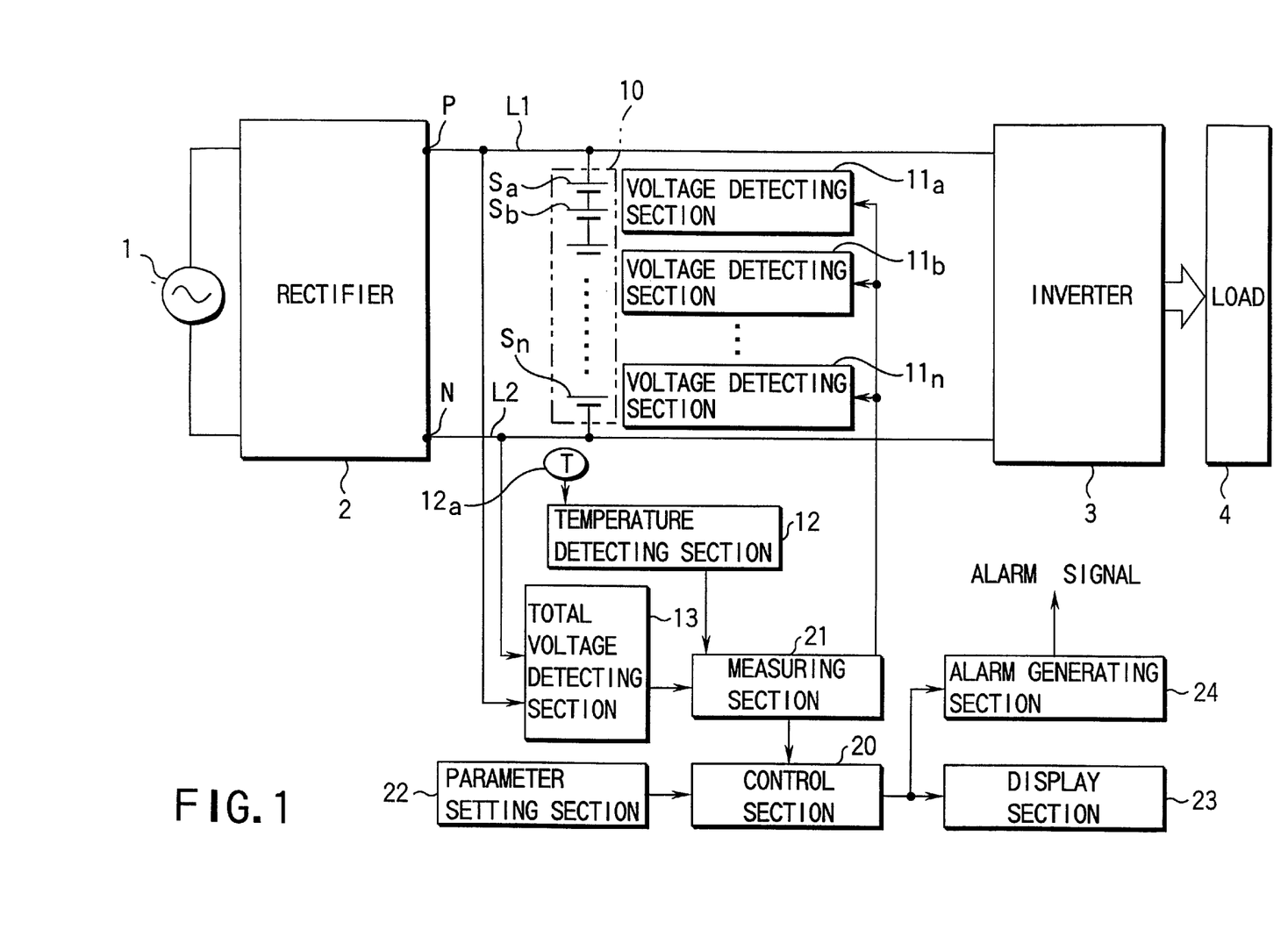
FIG. 1 is a block diagram showing an embodiment of this invention and an uninterruptible power supply system incorporating the embodiment.

As shown in FIG. 1, a rectifier 2 is connected to a commercial AC power supply 1. An inverter 3 is connected to the output terminals P and N of the rectifier 2 by DC power supply lines L1 and L2. The inverter 3 is switched, converting the output voltage of the rectifier 2 (a DC voltage) to an AC voltage having a predetermined frequency. The output of the inverter 3 is supplied to a load 4.

A battery unit 10 is connected between the DC power supply lines L1 and L2. The battery unit 10 comprises a plurality of storage batteries Sa, Sb, . . . Sn, which are connected in series. Each storage battery is a sealed-type lead storage battery.

The battery unit 10 can be operated in various modes, which are float charge mode, discharge mode and recharge mode.

In the float charge mode, the voltage of the power supply (rectifier 2) is applied to the load (inverter 3) connected to the battery unit 10, and the battery unit 10 is recharged by virtue of the voltage of the power supply (rectifier 2).

In the discharge mode, the voltage of the battery unit 10 is applied to the load (inverter 3) when the voltage of the power supply (rectifier 2) falls or is zero (when the supply of power is interrupted).

In the recharge mode, the battery unit 10 is recharged by virtue of the voltage of the power supply (rectifier 2), after the battery unit has operated in the discharge mode.

The rectifier 2, inverter 3 and battery unit 10 cope with the commercially available alternating current.

In this uninterruptible power supply system, voltage detecting sections (first voltage detecting means) 11a, 11b, . . . 11n are connected to the storage batteries Sa, Sb, . . . Sn of the battery unit 10, respectively, to detecting the voltages V of the storage batteries Sa, Sb, . . . Sn. Further, a temperature detecting section 12 is provided for the battery unit 10. The temperature detecting section 12 has a temperature sensor 12a attached to the battery unit 10. The temperature sensor 12a detects the temperature T of the battery unit 10 (or the ambient temperature of the battery unit 10).

A total voltage detecting section (second voltage detecting means) 13 is connected between the DC power supply lines L1 and L2, to detect the total voltage E of the battery unit 10.

A measuring section 21, a parameter setting section 22, a display section 23, and an alarm generating section 24 are connected to a control section 20.

The measuring section 21 performs A/D (analog-to-digital) conversion on the voltages V detected by the voltage detecting sections 11a, 11b, . . . 11n, the temperature T detected by the temperature detecting section 12, and the voltage E detected by the total voltage detecting section 13, thereby generating digital data. The digital data is supplied to the control section 20.

The parameter setting section 22 is designed to set various parameters for operating the control section 20.

The display section 23 displays (informing) the results of operation of the control section 20.

The alarm generating section 24 generates an alarm signal when the control section 20 detects a defect in any one of the storage batteries, detects an abnormal voltage in the battery unit 10, or determines that the death of any one of the storage batteries (namely, the death of the battery unit 10). The alarm signal is transmitted (or given) to a central control room where inspection-maintenance workers are stationed.

The control section 20 has the following functional means [1] to [8]:

[1] Operation mode determining means for determining in which mode the battery unit 10 is operating, float charge mode, discharge mode, or recharge mode.

[2] First defect detecting means for detecting defects in the storage batteries Sa, Sb, . . . Sn in accordance with whether the voltages V detected by the voltage detecting sections 11a, 11b, . . . 11n are lower than a predetermined low voltage $V_2$, if the operation mode determining means determines that the battery unit 10 is operating in the float charge mode.

[3] Second defect detecting means for detecting defects in the storage batteries Sa, Sb, . . . Sn in accordance with whether the voltages V detected by the voltage detecting sections 11a, 11b, . . . 11n are equal to or higher than a predetermined high voltage $V_3$, if the operation mode determining means determines that the battery unit 10 is operating in the float charge mode.

[4] Third defect detecting means for detecting defects in the storage batteries Sa, Sb, . . . Sn in accordance with whether the voltages V detected by the voltage detecting sections 11a, 11b, . . . 11n are lower than a predetermined low voltage $V_1$ ($<V_2$) upon lapse of a prescribed time (e.g., one minute) from the start of the discharge mode, if the operation mode determining means determines that the battery unit 10 is operating in the discharge mode.

[5] First abnormality detecting means for detecting an abnormal voltage in the battery unit 10 in accordance with whether the voltage E detected by the total voltage detecting section 13 remains equal to or higher than a predetermined maximum value Emax for a prescribed time (alarm masking time) ta.

[6] Second abnormality detecting means for detecting an abnormal voltage in the battery unit 10 in accordance with whether the voltage E detected by the total voltage detecting section 13 remains lower than a predetermined minimum value Emin for a prescribed time (alarm masking time) tb.

[7] Life determining mans for calculating an average of temperatures T detected by the temperature detecting section 12 at regular intervals (e.g., every hour), and for determining the life of the storage batteries Sa, Sb, . . . Sn (namely, the life of the battery unit 10) on the basis of the relation between the average temperature and Arrhenius' rule.

[8] Information means for informing the defects detected by the various defect detecting means, the abnormalities detected by the various abnormality detecting means, and the life determined by the life detecting means.

Figure 2:
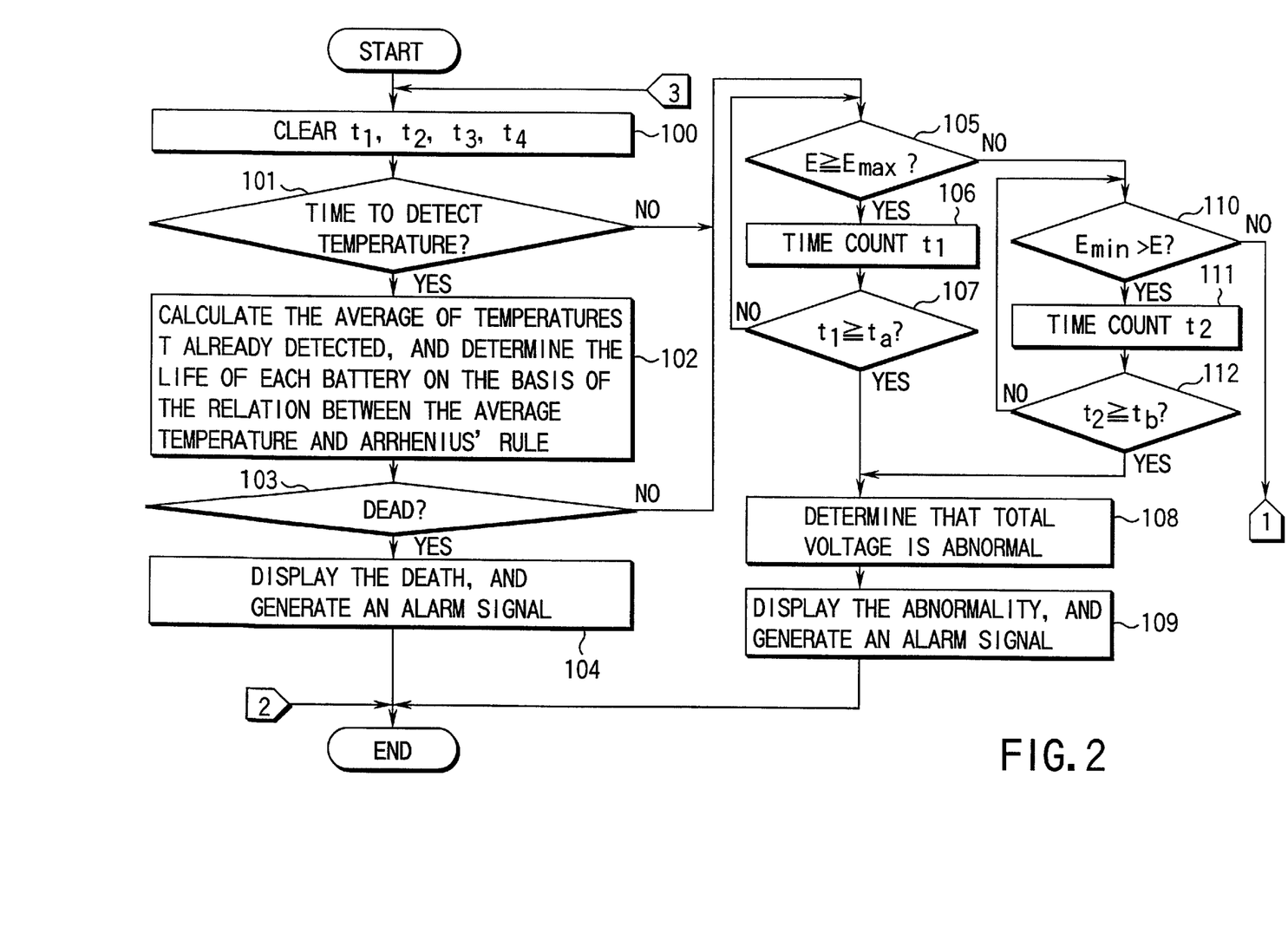
FIG. 2 is a flow chart for explaining the operation of this embodiment.
Figure 3:
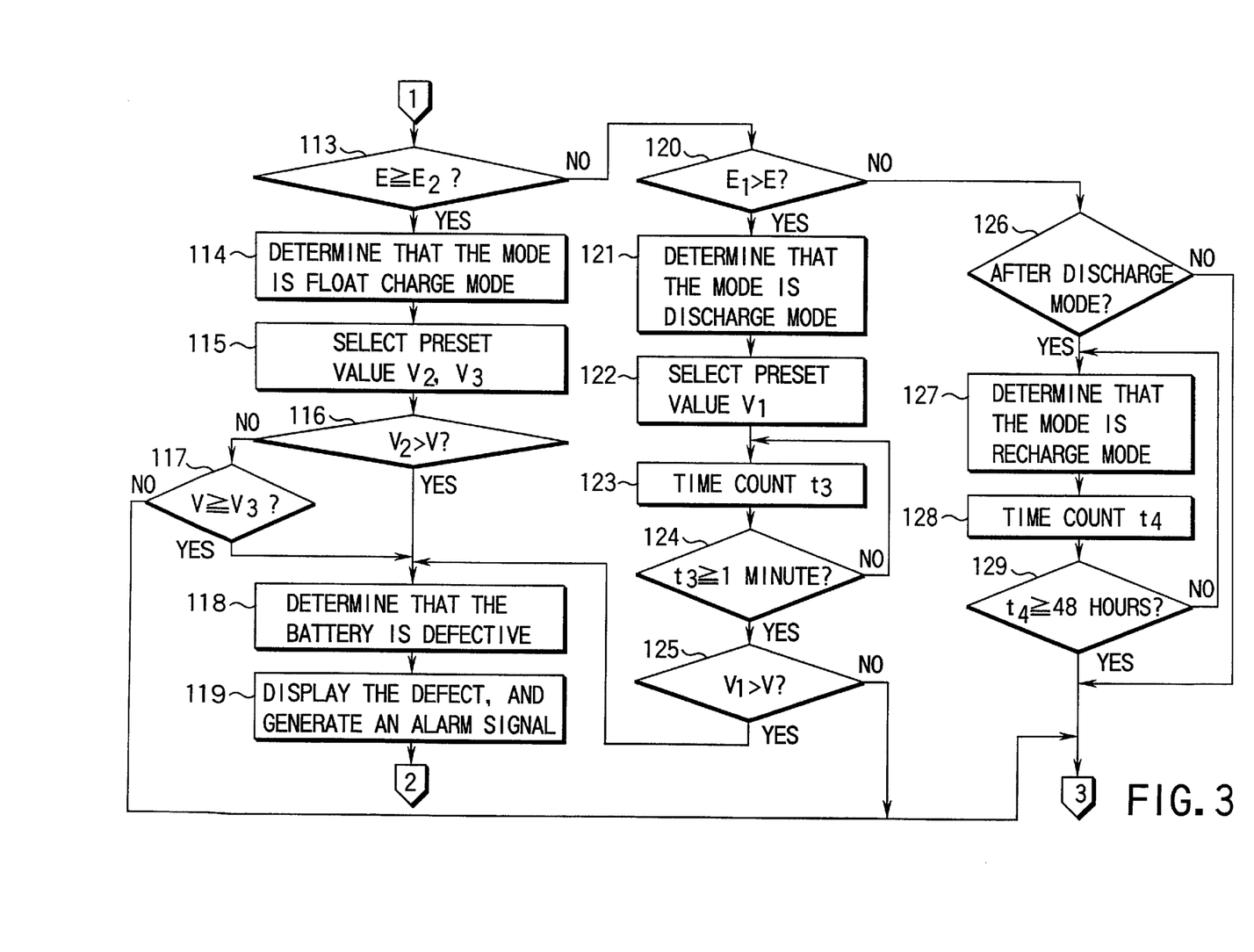
FIG. 3 is a flow chart continuous to the flow chart shown in FIG. 2.
Figure 4:
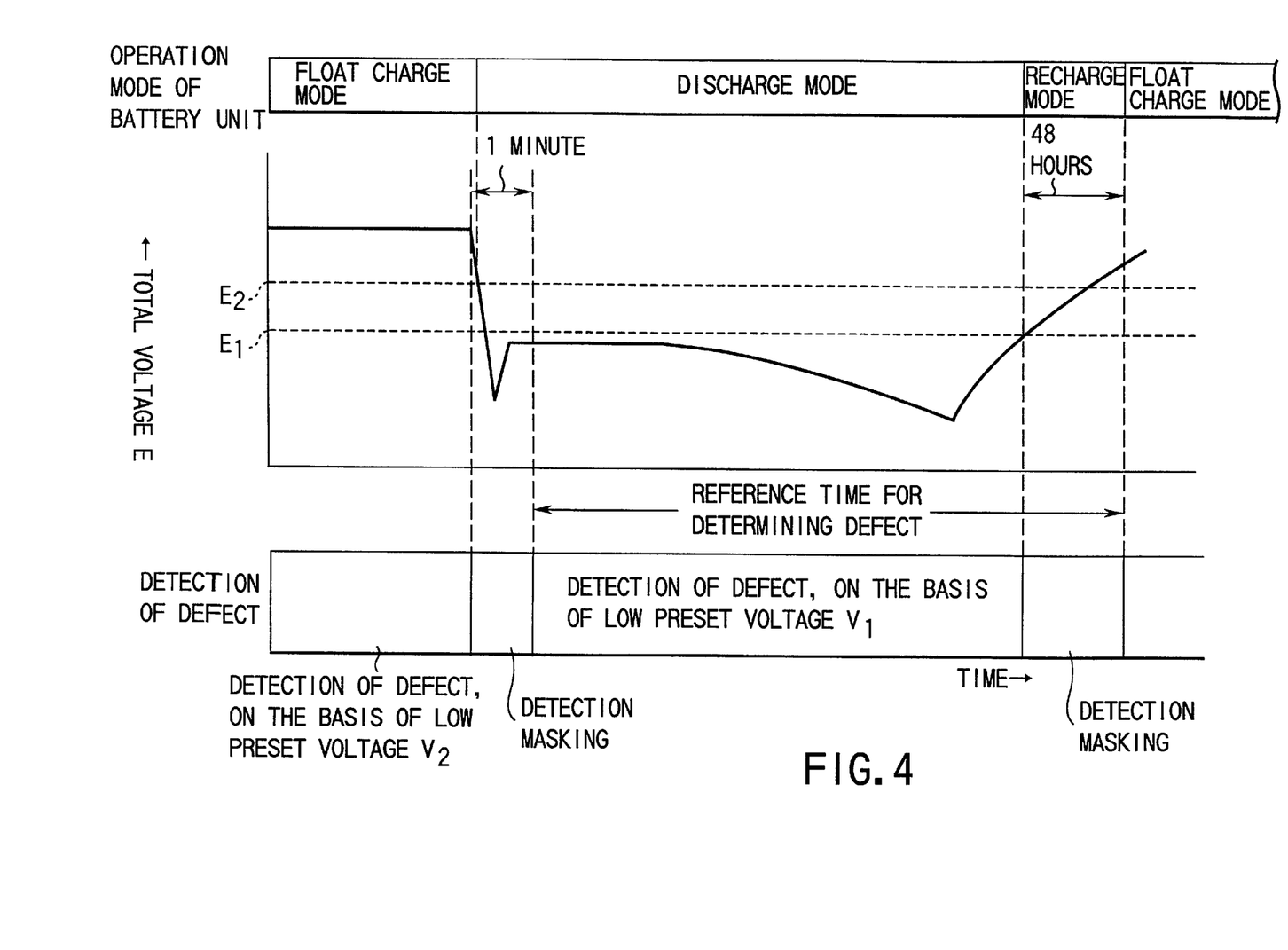
FIG. 4 is a chart for explaining how to determine the operation mode of the embodiment.

The operation of the structure described above will be described, with reference to the flow chart of FIGS. 2 and 3.

At first, time counts $t_1$, $t_2$, $t_3$ and $t_4$ are cleared (Step 101).

Upon lapse of a predetermined time, e.g., one hour, the temperature of the battery unit 10 is detected (if YES in Step 100). At the timing of detecting the temperature, the average (temperature of the battery unit 10) of the temperatures T that the temperature detecting section 12 has detected is calculated. On the basis of the relation between the average temperature and Arrhenius' rule, the life of the storage batteries Sa, Sb, . . . Sn (namely, the life of the battery unit 10) are determined (Step 102). If any storage battery is found to have dead (if YES in Step 103), the display section 23 displays this event and the alarm generating section 24 generates an alarm signal (Step 104).

Figure 8:
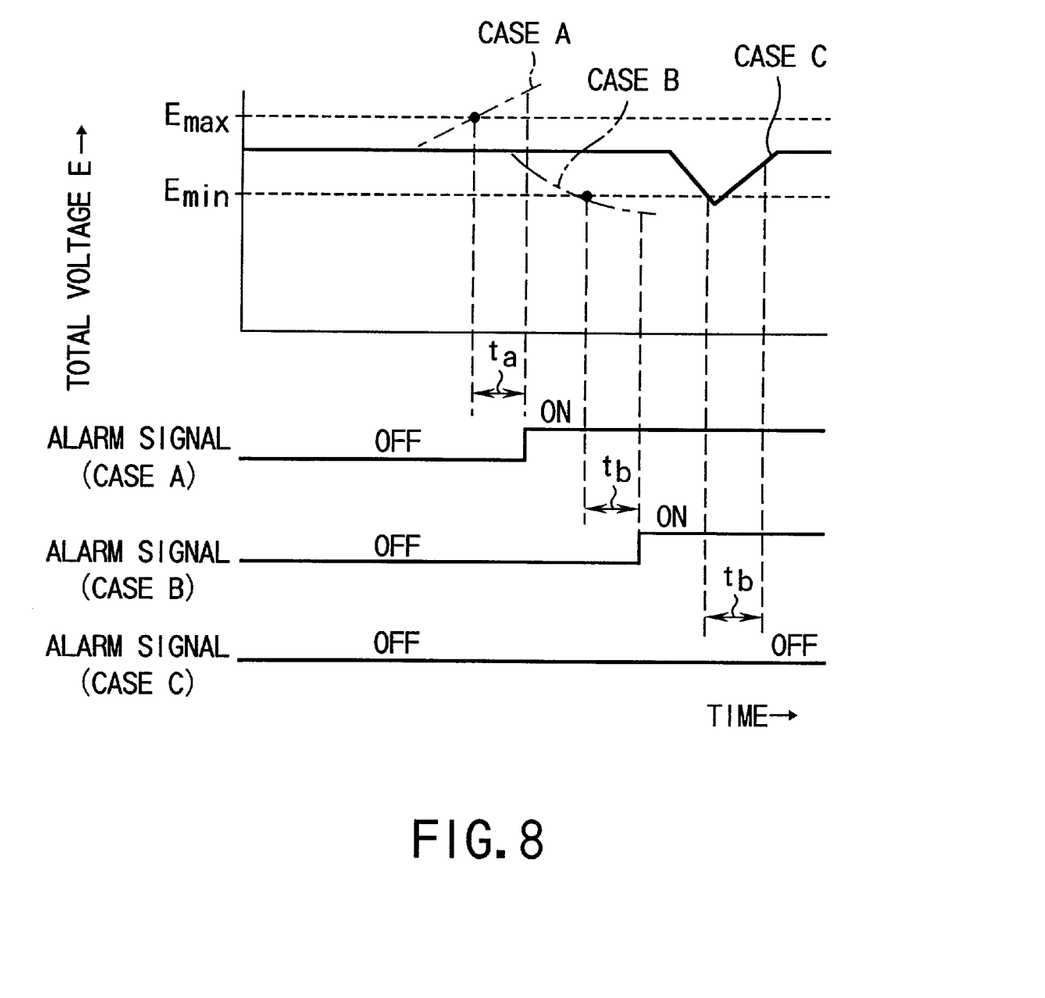
FIG. 8 is a chart for explaining how an abnormal voltage is detected in the battery unit in the embodiment.

The voltage E detected by the total voltage detecting section 13 may become equal to or higher than the predetermined maximum value Emax (if YES in Step 105), as in Case A illustrated in FIG. 8. In this case, the time count $t_1$ is started (Step 106). When the time count $t_1$ reaches the prescribed value ta (if YES in Step 107), it is determined that the total voltage E is abnormal (Step 108). The display section 23 displays this event and the alarm generating section 24 generates an alarm signal (Step 109).

The voltage E detected by the total voltage detecting section 13 may fall below predetermined minimum value Emin (if YES in Step 110), as in Case B illustrated in FIG. 8. If this happens, the time count $t_2$ is started (Step 111). When the time count $t_2$ reaches the prescribed value tb (if YES in Step 112), it is determined that the total voltage E is abnormal (Step 108). The display section 23 displays this event and the alarm generating section 24 generates an alarm signal (Step 109).

The voltage E detected by the total voltage detecting section 13 (i.e., the total voltage) is compared with values $E_1$ and $E_2$ ($E_1 < E_2$), the value $E_1$ preset for detecting discharge and the value $E_2$ preset for detecting the end of discharge (Step 113).

If the voltage E detected is equal to or higher than the preset value $E_2$ (if YES in Step 113), it is determined that the battery unit 10 is operating in the float charge mode (Step 114). In this case, the low voltage $V_2$ and the high voltage $V_3$ are selected, both preset as reference values for detecting defects in the storage batteries (step 115).

Figure 5:
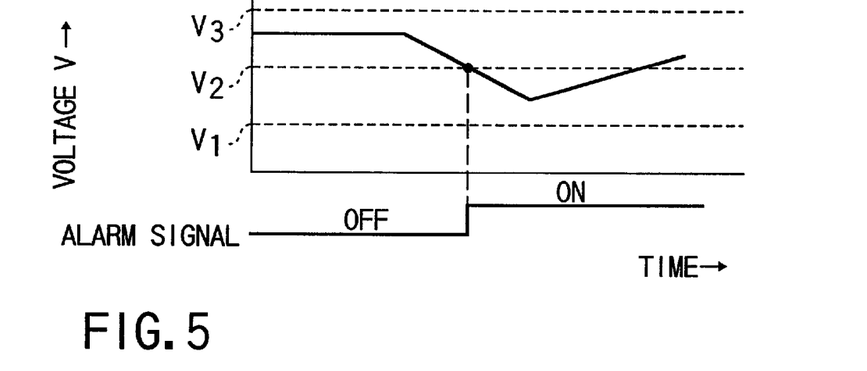
FIG. 5 is a chart for explaining how defects are detected in the embodiment operating in the float charge mode.

The voltage V detected by any one of the voltage detecting sections 11a, 11b, . . . 11n may fall below the low voltage $V_2$ as shown in FIG. 5, while the battery unit 10 is operating in the float charge mode. If so (if YES in Step 116), it is determined that the storage battery causing this voltage drop is defective (Step 118). The display section 23 displays this event and the alarm generating section 24 generates an alarm signal (Step 119).

Figure 7:
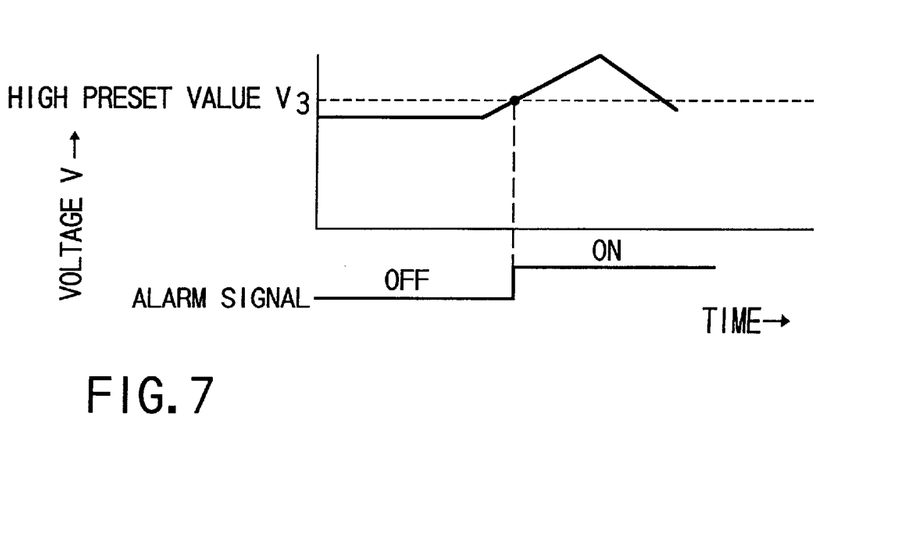
FIG. 7 is a chart for explaining how defects are detected in the embodiment operating in the float charge mode.

The voltage V detected by any one of the voltage detecting sections $11a$, $11b$, ... $11n$ may rises to or above the high voltage $V_3$ as shown in FIG. 7, while the battery unit 10 is operating in the float charge mode. If this happens (if NO in Step 116 and YES in Step 117), it is determined that the storage battery causing this voltage rise is defective (Step 118). The display section 23 displays this event and the alarm generating section 24 generates an alarm signal (Step 119).

The voltage E detected may falls below the preset value $E_2$ (NO in Step 113) and may be lower than the preset value $E_1$ (Step 120). If so, it is determined that the battery unit 10 is operating in the discharge mode (Step 121). In this case, the low voltage value $V_1$ ($<V_2$) is selected as reference for detecting a defect in each of the storage batteries (Step 122).

In the discharge mode, the time count $t_3$ is started at the same time it is determined that the battery unit 10 is operating in the discharge mode (Step 123). When the time count $t_3$ reaches one minute (i.e., the detecting masking time) (YES in Step 124), the voltages V detected by the voltage detecting sections $11a$, $11b$, ... $11n$ are compared with the low voltage value $V_1$ ($<V_2$) selected (Step 125).

Figure 6:
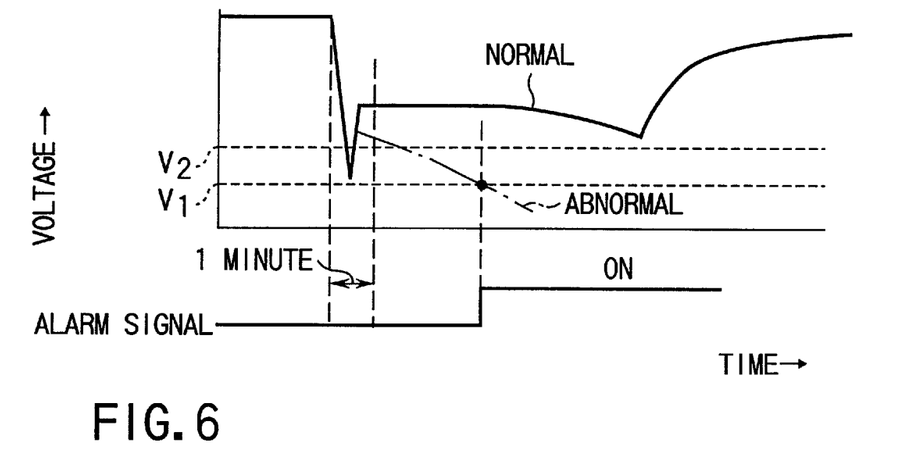
FIG. 6 is a chart for explaining how detect are defected in the embodiment operating in the discharge mode.

If any one of the voltages V detected is lower than the preset low voltage value $V_1$ bas shown in FIG. 6 (if YES in Step 125), it is determined that the storage battery causing this voltage drop is defective (Step 118). The display section 23 displays this event and the alarm generating section 24 generates an alarm signal (Step 119).

If the detected voltage E rises to or above the preset value $E_1$ (if NO in Step 120) and if the discharge mode is no longer valid (if YES in Step 126), it is determined that the battery unit 10 is operating in the recharge mode (Step 127). At the same time it is determined so, the time count $t_4$ is started (Step 128). Until the time count $t_4$ reaches 48 hours (if NO in Step 129), it is determined that recharge mode remains valid, regardless of changes in the detected voltage E (Step 127). Thus, for 48 hours corresponding to the time count $t_4$, it is not determined whether or not a defect exists in each storage battery (detection masking).

As informed above, an abnormal voltage of the battery unit 10 and defects in the storage batteries Sa, Sb, ... Sn can be reliably detected without requiring the service of inspection-maintenance workers. In addition, the life of each storage battery can be determined and informed without requiring the service of inspection-maintenance workers.

The battery unit 10 and the storage batteries Sa, Sb, ... Sn can be automatically managed with high reliability.

The voltage detecting sections $11a$, $11b$, ... $11n$ are connected to the battery unit 10 and storage batteries Sa, Sb, ... Sn by means of the connecting device shown in FIGS. 9, 10 and 11. These figures illustrates only the connection of the storage battery Sa and the voltage detecting section $11a$. Any other voltage detecting section is connected to the associated storage battery in the same manner.

Figure 9:
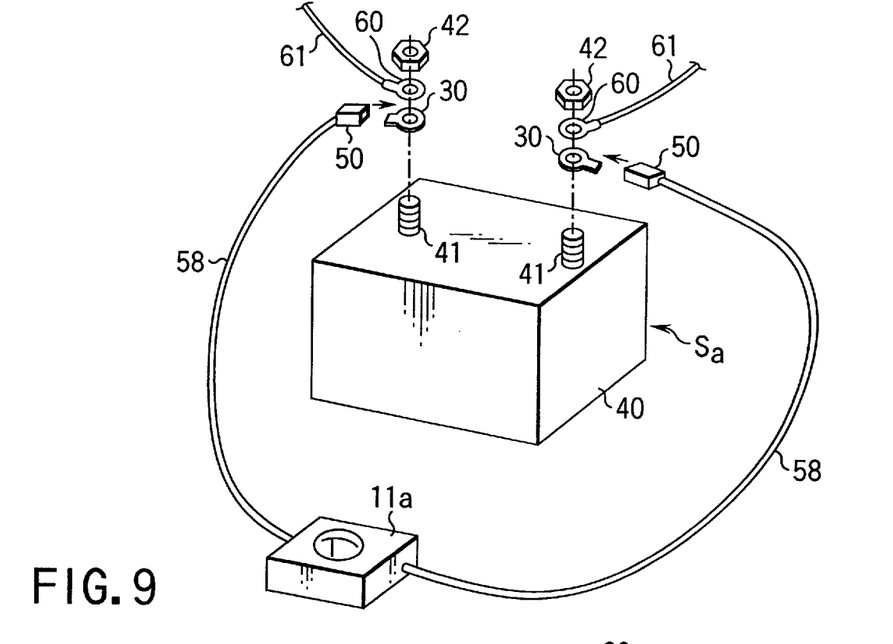
FIG. 9 is a diagram showing a storage battery related to the embodiment and a connecting device used in the embodiment.

The storage battery Sa has a pair of bolt-shaped electrodes 41, which protrude from the upper surface of the sealed jar 40.

An electrically conductive washer 30 is secured to each of the electrodes 41. A connecting member 50, known as "female tab," is attached to the washer 30. A wire 58 is led from the female tab 50 and is connected to the voltage detecting section $11a$.

A nut 42 is mounted on each electrode 41 of the storage battery Sa. The washer 30 and a connecting member 60 are attached to each electrode 41 in the order mentioned, and the nut 42 is fastened, gripping the electrode 41. The wire 61 led from each connecting member 60 is connected to one electrode 41 of the next storage battery Sb.

Figure 10:
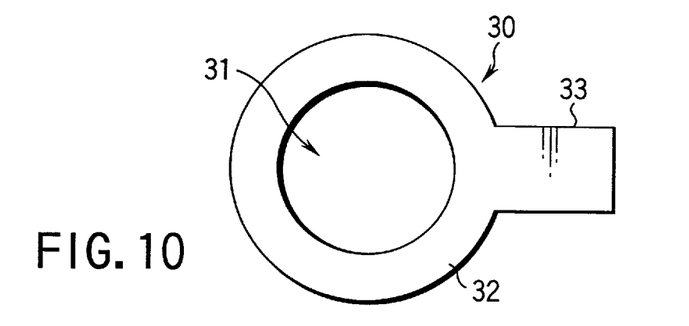
FIG. 10 is a view showing a washer used in the embodiment.

As shown in FIG. 10, the washer 30 has a ring-shaped part 32 and a flat connecting strip 33. The strip 33 outwardly protrudes from the ring-shaped part 32 in the radial direction and can be attached to and removed from the electrode 41. The electrode 41 can pass through the hole 31 of the ring-shaped part 32. The connecting strip 33 has such shape and size that it can be sufficiently inserted in the female tab 50 even when the nut 42 is fastened, gripping the electrode 41.

Figure 11:
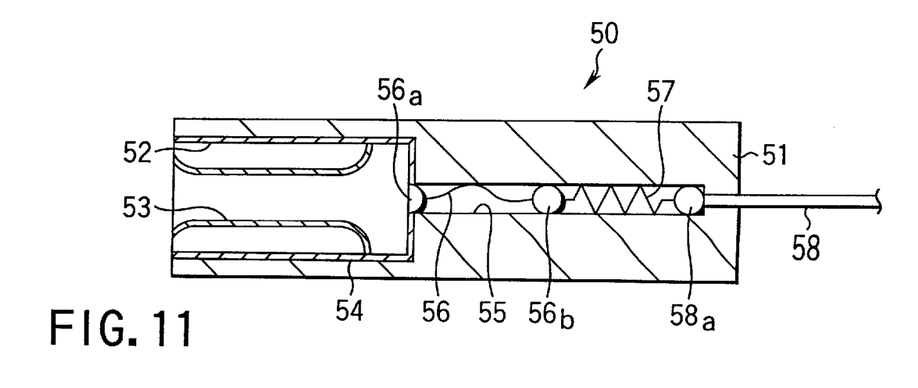
FIG. 11 is a sectional view of the female tab used in the embodiment.

The female tab 50 comprises a housing 51 made of insulating material, a recess 52 made in one end of the housing 51, a pair of electrically conductive holding members 53 provided in the recess 52, a conductor 54 provided in the recess 52 and electrically connected to the holding members 53, a part-accommodating hole 55 extending from the bottom of the recess 52 to the proximal end $58a$ of a wire 58, and a series circuit composed of a fuse 56 and a resistor 57 which are provided in the part-accommodating hole 55.

One end $56a$ of the fuse 56 is connected to the conductor 54. The other end of the fuse 56 is connected by the resistor 57 to the proximal end $58a$ of the wire 58.

The resistor 57 functions as a protection resistor for preventing short-circuiting, if any in the load (i.e., wire 58 or voltage detecting section $11a$), from changing the voltage of the storage battery Sa. The fuse 56 melts to prevent an excessively large current from flowing through the female tab 50 if short-circuiting or the like occurs in the load (i.e., wire 58 or voltage detecting section $11a$).

The recess 52 is formed so large that the tab 33 can be fully inserted into it. Each holding member 53 has been formed by bending a thin metal plate having electrical conductivity. The holding members 53 work like leaf springs, reliably contacting and clamping the connecting strip 33 inserted in the recess 52. Due to the clamping, the washer 30 and the wire 58 are electrically connected to each other by the holding members 53, conductor part 54, fuse 56 and resistor 57. Each holding member 53 is inclined or curved in the open end of the recess 52, so that the connecting strip 33 may be smoothly inserted into the recess 52.

As described above, a washer 30 is fastened on each electrode 41 of the storage batter Sa, and a female tab 50 is attached to the connecting strip 33 of the washer 30. The storage battery Sa and the voltage detecting section $11a$ can thereby connected easily and reliably. That is, the voltage detecting section $11a$ can be easily connected to the storage battery Sa, without removing the nut 42 or the connecting member 60 from the electrode 41 and without suspending the operation of the uninterruptible power supply system. Further, the efficiency of connecting the section $11a$ to the battery Sa is enhanced.

Since each holding members 53 of the female tab 50 reliably contacts the connecting strip 33 of the washer 30, stable and good electrical connection is maintained between the storage battery Sa and the voltage detecting section $11a$.

If short-circuiting happens in the wire 58 or the voltage detecting section $11a$, unnecessary voltage changes can be prevented in the storage battery Sa. This is because each female tab 50 has a resistor 57.

An excessively large current may flow through each female tab 50 due to short-circuiting in the wire 58 or the voltage detecting section $11a$. In this case, the fuse of the female tab 50 melts, thereby preventing a fire or the like.

In the embodiment described above, each holding member 53 has been formed by bending a metal plate. Nonetheless, there is no limitation to the shape and the like of each holding member 53. The member 53 may have any shape, provided that it can reliably contact the connecting strip 33. For example, one of the holding members 53 may be formed by bending a metal plate, and the other holding member 53 may be an insulating member made of rubber or the like.

There are no limitation to the shape of the washer 30, either.

The apparatus described above is designed for use in an uninterruptible power supply system. Nevertheless, the apparatus can be used in any other system that has storage batteries.

The present invention is not limited to the embodiment described above. Various changes and modifications can be made within the scope and spirit of the invention.

What is claimed is:

1. An apparatus for managing a battery unit having a plurality of storage batteries, comprising:
   a plurality of first voltage detecting means for detecting voltages of the storage batteries, respectively;
   second voltage detecting means for detecting a total voltage of the battery unit;
   defect detecting means for detecting defects in the storage batteries on the basis of the voltages detected by the first voltage detecting means;
   abnormality detecting means for detecting an abnormal voltage in the battery unit on the basis of the voltage detected by the second voltage detecting means;
   temperature detecting means for detecting temperature in the battery unit;
   battery life determining means for determining a life of each of the storage batteries has dead, on the basis of the temperature detected by the temperature detecting means; and
   information means for informing results of the detection performed by the defect detecting means and abnormality detecting means and results of the determination made by the battery life determining means.

2. An apparatus according to claim 1, wherein the storage batteries are sealed-type lead storage batteries and are connected in series.

3. An apparatus according to claim 1, further comprising operating mode determining means for determining an operation mode of the battery unit.

4. An apparatus according to claim 3, wherein the defect detecting means detects defects in the storage batteries by comparing the voltages detected by the first voltage detecting means with a level set on the basis of the operation mode determined by the operating mode determining means.

5. An apparatus according to claim 3, wherein the abnormality detecting means detects an abnormal voltage in the battery unit by comparing the voltage detected by the second voltage detecting means with a predetermined upper-limit value and by comparing the voltage detected by the second voltage detecting means with a predetermined lower-limit value.

6. An apparatus according to claim 3, wherein the operating mode determining means determines in which operation mode the battery unit is operating, float charge mode, discharge mode, or recharge mode, on the basis of the voltage detected by the second voltage detecting means; in said float charge mode, the voltage of a power supply connected to the battery unit is applied to a load connected to the battery unit, and the battery unit is charged by virtue of the voltage of the power supply; in said discharge mode, the voltage of the battery unit is applied to the load when the voltage of the power supply falls or is zero; and in said recharge mode, the battery unit is recharged by virtue of the voltage of the power supply after the battery unit has operated in the discharge mode.

7. An apparatus according to claim 6, wherein the defect detecting means comprises first defect detecting means, second defect detecting means, and third defect detecting means; said first defect detecting means detects defects in the storage batteries in accordance with whether the voltages detected by the first voltage detecting means are lower than a predetermined low voltage $V_2$, when the operation mode determined by the operation mode determining means is the float charge mode; said second defect detecting means detects defects in the storage batteries in accordance with whether the voltages detected by the first voltage detecting means are equal to or higher than a predetermined high voltage $V_3$, when the operation mode determined by the operation mode determining means is the float charge mode; and the third defect detecting means for detecting defects in the storage batteries in accordance with whether the voltages detected by the first voltage detecting means are lower than a predetermined low voltage $V_1$ ($<V_2$) upon lapse of a prescribed time from the start of the discharge mode, when the operation mode determined by the operation mode determining means is the discharge mode.

8. An apparatus according to claim 6, wherein the abnormality detecting means comprises first abnormality detecting means and second abnormality detecting means; said first abnormality detecting means detects an abnormal voltage in the battery unit in accordance with whether the voltage detected by the second voltage detecting means remains equal to or higher than a predetermined maximum value for a prescribed time; and the second abnormality detecting means for detecting an abnormal voltage in the battery unit in accordance with whether the voltage detected by the second voltage detecting means remains lower than a predetermined minimum value for a prescribed time.

9. An apparatus according to claim 1, wherein each of said storage batteries has a pair of electrodes.

10. An apparatus according to claim 9, further comprising connecting devices, each for the connecting one electrodes of one storage battery to one first voltage detecting means.

11. An apparatus according to claim 10, wherein each of the connecting devices comprises a washer to be removably attached to one electrode, a connecting member to be removably connected to the washer, and a wire extending from the connecting member.

12. An apparatus according to claim 11, wherein the washer has a ring-shaped part and a connecting strip extending outwardly from the ring-shaped part in a radial direction thereof; the connecting member has a recess for receiving and holding the connecting strip of the washer and a series circuit provided between the recess and the wire and composed of a fuse and a resistor; and series circuit connects the connecting strip to the wire when the connecting strip is inserted into the recess.

* * * * *

UNITED STATES PATENT AND TRADEMARK OFFICE
CERTIFICATE OF CORRECTION

PATENT NO. : 6,014,012
DATED : January 11, 2000
INVENTOR(S) : T. Murao et al.

It is certified that error appears in the above-identified patent and that said Letters Patent is hereby corrected as shown below:

ON THE TITLE PAGE

[56]  Refs. Cited  Insert following reference:
(Other Info.)  --Motozu, T., et al., "Long Lifetime VRLA Batteries and Battery Management System," *Institute of Electric Engineers of Japan*, March 13, 1998.--

Signed and Sealed this

Twenty-ninth Day of May, 2001

*Attest:*

NICHOLAS P. GODICI

*Attesting Officer*  Acting Director of the United States Patent and Trademark Office